(12) United States Patent
Belostotski et al.

(10) Patent No.: US 11,233,521 B2
(45) Date of Patent: Jan. 25, 2022

(54) SUB-RANGING ANALOG TO DIGITAL CONVERTER

(71) Applicant: UTI LIMITED PARTNERSHIP, Calgary (CA)

(72) Inventors: Leo Belostotski, Calgary (CA); Eugene Zailer, Calgary (CA); Ge Wu, Calgary (CA)

(73) Assignee: UTI Limited Partnership, Calgary (CA)

( * ) Notice: Subject to any disclaimer, the term of this patent is extended or adjusted under 35 U.S.C. 154(b) by 0 days.

(21) Appl. No.: 16/929,421

(22) Filed: Jul. 15, 2020

(65) Prior Publication Data

US 2021/0021278 A1    Jan. 21, 2021

Related U.S. Application Data

(60) Provisional application No. 62/874,727, filed on Jul. 16, 2019.

(51) Int. Cl.
*H03M 1/14* (2006.01)
*H03M 1/12* (2006.01)

(52) U.S. Cl.
CPC ......... *H03M 1/145* (2013.01); *H03M 1/1205* (2013.01); *H03M 1/1245* (2013.01)

(58) Field of Classification Search
CPC .. H03M 1/145; H03M 1/1245; H03M 1/1205; H03M 1/36; H03M 1/164
See application file for complete search history.

(56) References Cited

U.S. PATENT DOCUMENTS

| 5,585,796 | A | * | 12/1996 | Svensson | ............ | H03M 1/1215 341/155 |
| 5,982,313 | A |   | 11/1999 | Brooks et al. | | |
| 6,489,913 | B1 |   | 12/2002 | Hansen et al. | | |
| 6,583,747 | B1 | * | 6/2003 | van der Goes | .. | H03K 17/04106 341/156 |

(Continued)

OTHER PUBLICATIONS

Alpman, E., et al. "A 1.1V 50mW 2.5GS/s 7b Time-Interleaved C-2C SAR ADC in 45nm LP digital CMOS", Feb. 9, 2009, IEEE International Solid-State Circuits Conference, 2009 IEEE. 3 Pages.

(Continued)

*Primary Examiner* — Lam T Mai
(74) *Attorney, Agent, or Firm* — Brion Raffoul; Art Brion

(57) ABSTRACT

Systems and methods relating to analog-to-digital converters. A delay block receives an input signal at the same time as a coarse ADC (CADC) block. The CADC block produces a multi-bit output and this output is applied to a signal processing block. The delay block delays the input signal from being applied to the signal processing block until the output of the CADC block has been applied/configures the signal processing block. The signal processing block may be a signal shifter, the output of which is ultimately applied to a fine ADC (FADC) block. In an alternative, the signal processing block may be the FADC block. Regardless of the configuration, the output of the CADC is delayed until the output of the FADC block is available. The outputs of the CADC and the FADC blocks are then simultaneously applied to an encoder that produces the overall system output.

20 Claims, 10 Drawing Sheets

(56) References Cited

U.S. PATENT DOCUMENTS

| | | | |
|---|---|---|---|
| 6,628,224 B1* | 9/2003 | Mulder | H03K 17/04106 341/156 |
| 6,697,005 B2* | 2/2004 | Mulder | H03K 17/04106 341/154 |
| 7,187,318 B1 | 3/2007 | Lee et al. | |
| 7,791,523 B2 | 9/2010 | Zhuang | |
| 7,808,417 B2 | 10/2010 | Nazemi | |
| 7,978,105 B2* | 7/2011 | Oo | H03M 1/06 341/120 |
| 7,978,116 B2 | 7/2011 | Murden et al. | |
| 8,164,497 B2 | 4/2012 | Nam et al. | |
| 8,188,901 B1* | 5/2012 | Inamdar | H03M 3/46 341/156 |
| 9,264,059 B2 | 2/2016 | Tousi et al. | |
| 10,230,389 B1* | 3/2019 | Inamdar | H03M 1/0854 |
| 2010/0103010 A1* | 4/2010 | Zhuang | H03M 1/122 341/141 |
| 2010/0182175 A1* | 7/2010 | Oo | H03M 1/36 341/120 |
| 2015/0249445 A1 | 9/2015 | Dong et al. | |

OTHER PUBLICATIONS

Chung, Y., et al. "A 16-mW 8-Bit 1-GS/s subranging ADC in 55nm CMOS", 2011, 2011 Symposium on VLSI Circuits Digest of Technical Papers, IEEE. 2 Pages.

Figueiredo, P.M, et al. "A 90nm CMOS 1.2v 6b 1GS/s two-step subranging ADC", Feb. 8, 2006, IEEE International Solid State Circuits Conference, 2006 IEEE. 10 Pages.

Greshishchev, Y.M., et al. "A 40GS/s 6b ADC in 65nm CMOS", Feb. 10, 2010, IEEE International Solid-State Circuits Conference, 2010 IEEE. 3 Pages.

Hu, Y., et al. "A 0.6V 6.4fJ/conversion-step 10-bit 150MS/s Subranging SAR ADC in 40nm CMOS" Nov. 10-12, 2014, IEEE Asian Solid-State Circuits Conference, Kaohsiung, Taiwan. 4 Pages.

Lien, Y. "A 4.5-mW 8-b 750-MS/s 2-b/Step Asynchronous Subranged SAR ADC in 28-nm CMOS Technology", 2012, 2012 Symposium on VLSI Circuits Digest of Technical Papers, 2012 IEEE. 2 Pages.

Limotyrakis, S., et al. "A 150-MS/s 8-b 71-mW CMOS Time-Interleaved ADC" May 2005, vol. 40. No. 5. IEEE Journal of Solid-State Circuits, 2005 IEEE. 11 Pages.

Vaz, B., et al. "A 1.5-V 10-b 50 MS/s Time-Interleaved Switched-Opamp Pipeline CMOS ADC with High Energy Efficiency" 2004, 2004 Symposium On VLSI Circuits Digest of Technical Papers, 2004 IEEE. 4 Pages.

Wu, G., et al. "A 10-GS/s Track-and-Hold Circuit for a 7-bit Square Kilometre Array ADC in 65-nm" 2017 IEEE. 4 Pages.

Xing, D., et al. "Design of a High-Speed Time-Interleaved Sub-Ranging SAR ADC With Optimal Code Transfer Technique" Feb. 2019, vol. 66, No. 2, IEEE Transactions on Circuits and Systems—I: Regular Papers, 2018 IEEE. 13 Pages.

Xu, Y., et al. "A 65-nm CMOS 10-GS/s 4-bit Background-Calibrated Noninterleaved Flash ADC for Radio Astronomy" Nov. 2014, vol. 22, No. 11, IEEE Transactions on Very Large Scale Integration (VLSI) Systems, 2013 IEEE. 10 Pages.

Liu, J., et al. "A 0.029-mm2 17-fJ/Conversion-Step Third-Order CT DS ADC With a Single OTA and Second-Order Noise-Shaping SAR Quantizer" Feb. 2019, vol. 54, No. 2, IEEE Journal of Solid-State Circuits. 13 Pages.

Valburg, J., et al. "An 8-b 650-MHz Folding ADC" Dec. 1992, vol. 27. No. 12, IEEE Journal of Solid-State Circuits. 1992 IEEE. 5 Pages.

* cited by examiner

SUB-RANGING ANALOG TO DIGITAL CONVERTER

RELATED APPLICATIONS

This application is a non-provisional patent application which claims the benefit of U.S. provisional application No. 62/874,727 filed on Jul. 16, 2019.

TECHNICAL FIELD

The present invention relates to electronic circuitry. More specifically, the present invention relates to analog-to-digital converter (ADC) circuitry.

BACKGROUND

An analog to digital converter (ADC) is a common type of circuit used in many applications. The purpose of the ADC is to assign a multi-bit digital value to a voltage or current input based on some predetermined reference range. The typical ADC consists of several key components that are mostly topology-specific but can include circuits such as, but not limited to, a track-and-hold (T/H), comparators, error correction circuits, and many others. There is a variety of topologies that have been developed. Some consist of only a single ADC core, such as a Delta-Sigma ADC, a Successive Approximation (SAR) ADC, a Flash ADC, and a time-domain (TD) ADC. Some ADC topologies take advantage of more than one core ADC to result in time-interleaved (TI) ADCs, sub-ranging (SR) ADCs, pipelined ADCs, and folding ADCs to improve the speed and/or resolution of Delta-Sigma ADCs, SAR ADCs, and Flash ADCs.

Out of the single-core topologies, the Flash ADC has the capability to achieve the highest sampling rate but at the cost of low resolution. All of the other single-core topologies can also achieve high resolution but also at the cost of low sampling rates. Multi-core ADCs can operate at very high sampling rates but, at such rates, their resolution is limited.

The resolution of multi-core ADCs can be improved by employing two low resolution ADCs, such as in a sub-ranging ADC. Such multi-core ADCs require a low number of comparators thereby consuming low power and providing a low capacitive loading on the input-signal source. As a rough estimate, with a two 4-bit ADCs, a sub-ranging ADC can nearly achieve an 8-bit resolution with just $2 \times 2^4 = 32$ comparators. Other ADCs, such as Flash ADCs, can achieve similar resolutions but with $2^8 = 128$ comparators.

A sub-ranging ADC can use two or more sub-ADCs as shown in FIG. 1.

Referring to FIG. 1, the sub-ranging ADC illustrated consists of a track-and-hold (T/H) circuit 101, a coarse ADC (CADC) 102 and a fine ADC (FADC) 103. When the CADC has completed conversion of its analog input to a digital multi-bit output, this multi-bit output instructs the sub-range multiplexer (MUX) 104 to either configure the FADC 103 input range or to configure the FADC 103 reference levels so as to provide fine conversion of the FADC input to multi-bit digital output. The two multi-bit streams, from the CADC and the FADC, arrive at encoder 105. This encoder combines these multi-bit streams to generate the final ADC output.

In a sub-ranging ADC, the FADC is used to improve resolution of the overall ADC by only focusing the operation of the FADC around the input signal voltage level. In contrast, the resolution of the CADC is coarse as this is designed to operate over the full input signal range of the overall ADC.

One advantage of Flash ADCs is that all comparators operate simultaneously thereby allowing such Flash ADCs to operate at clock speeds that are only limited by a particular technology that is selected for the ADC implementation.

Current sub-ranging ADCs cannot operate at these clock speeds. In sub-ranging ADCs, the output of the FADC is not valid until the CADC has completed its operation and until the sub-range MUX has configured the FADC appropriately. Therefore, the CADC and Sub-range MUX both block the FADC from simultaneous operation. As the result, for such sub-ranging ADCs, the ADC clock has to be reduced to maintain the output of the T/H circuit long enough for FADC to complete its operation.

To improve the above, more than one T/H, CADC, and FADC can be used to perform data conversion in an interleaved fashion. By doing so, the advantage for having fewer comparators relative to Flash ADC becomes less significant but this is achieved at the cost of increasing the complexity of the circuit.

From the above, there is, therefore, a need for a non-blocking sub-ranging ADC where the CADC and FADC can operate at the maximum clock speed afforded by the selected semiconductor technology.

SUMMARY

The present invention provides systems and methods relating to analog-to-digital converters. A delay block receives an input signal at the same time as a coarse ADC (CADC) block. The CADC block produces a multi-bit output and this output is applied to a signal processing block. The delay block delays the input signal from being applied to the signal processing block until the output of the CADC block has been applied/configured the signal processing block. The signal processing block may be a signal shifter, the output of which is ultimately applied to a fine ADC (FADC) block. In an alternative, the signal processing block may be the FADC block. Regardless of the configuration, the output of the CADC is delayed until the output of the FADC block is available. The outputs of the CADC and the FADC are then simultaneously applied to an encoder that produces the overall system output.

In a first aspect, the present invention provides a system for assigning a digital value to a current or voltage signal level, the system comprising:
 a coarse ADC block for receiving an input signal and for performing a coarse analog-to-digital conversion process on said input signal; and
 a delay block for delaying said input signal prior to passing said input signal to a further processing block that is configured based on an output of said coarse ADC block;
 wherein said delay block delays said input signal to allow said further processing block to be configured by said output of said coarse ADC block and wherein said coarse analog-to-digital conversion process is applied over a full input signal range.

In another aspect, the present invention provides a method for converting analog values to digital values, the method comprising:
 a) simultaneously receiving an input analog value at a delay element and at a coarse ADC element;
 b) delaying said input value until said coarse ADC element has an output based on said input value;

c) processing said delayed input value and said output of said coarse ADC element using a fine ADC element;

d) receiving said output of said coarse ADC element and an output of said fine ADC element at an encoder, said output of said fine ADC element being based on said delayed input value.

BRIEF DESCRIPTION OF THE DRAWINGS

The embodiments of the present invention will now be described by reference to the following figures, in which identical reference numerals in different figures indicate identical elements and in which.

DETAILED DESCRIPTION

Figure 1:
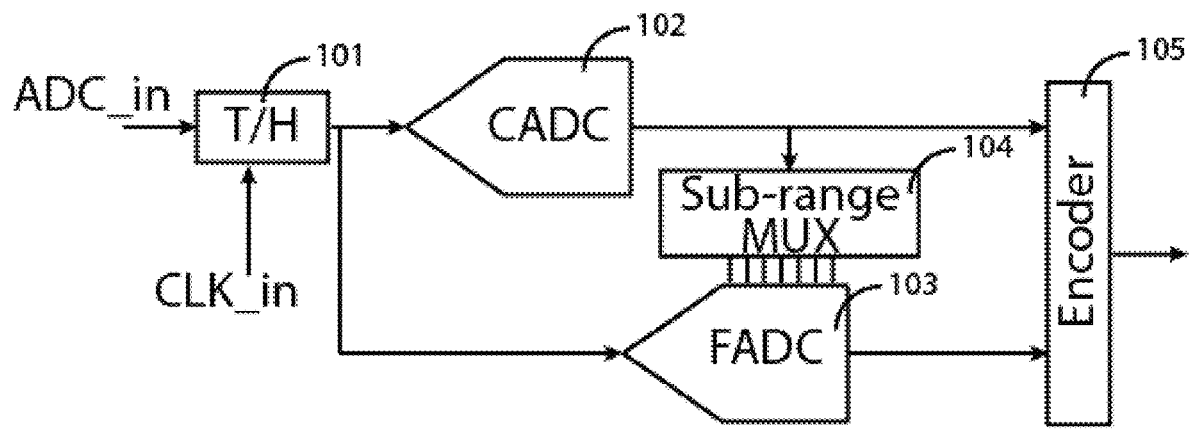
FIG. 1 is a block diagram of an ADC system according to the prior art.
Figure 2:
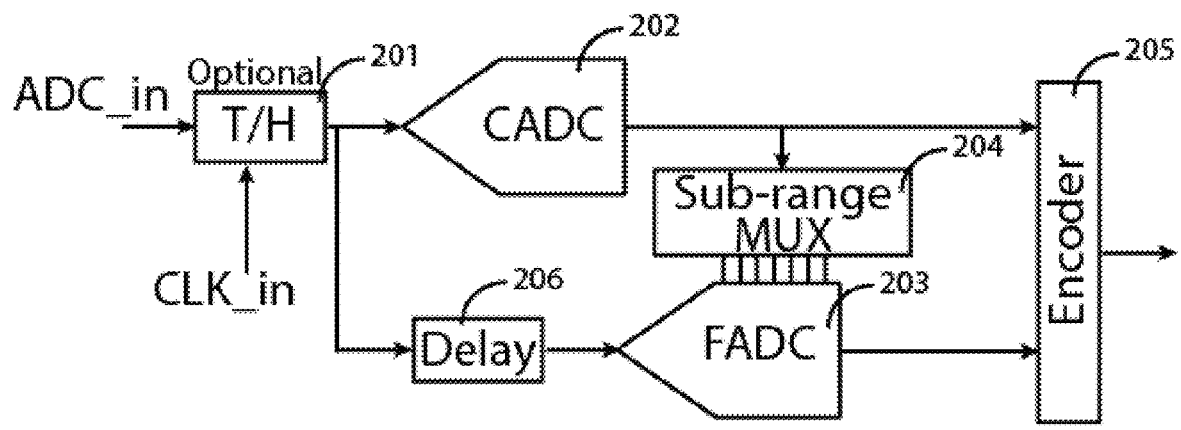
FIG. 2 is a block diagram of an ADC system according to one aspect of the present invention.
Figure 3:
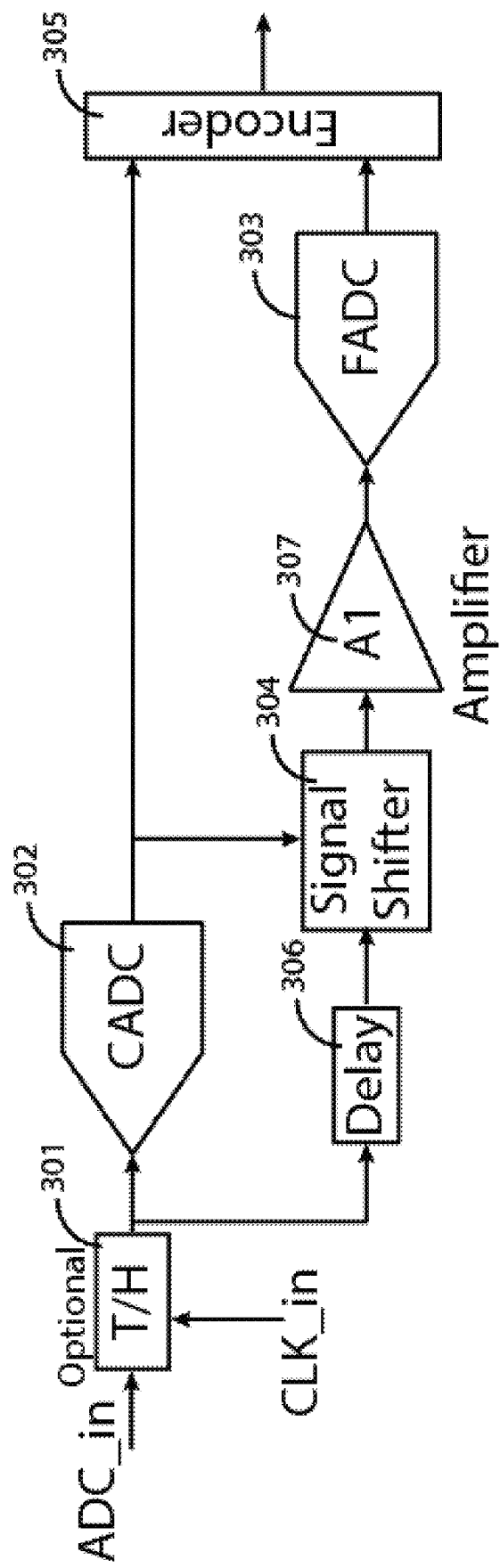
FIG. 3 is a block diagram of an ADC system according to another aspect of the present invention.

In one aspect, the invention involves sub-ranging ADCs and pipelined ADCs that have sub-ranging ADC cells. In another aspect, the present invention presents a systems and methods that overcome the sampling rate limitations due to a delay of the outputs of the CADC and of the sub-ranging MUX. Referring to FIG. 2 and FIG. 3, the ADC has an optional T/H circuit 201, 301, a CADC 202, 302, a FADC 203, 303, a signal shifter 304 and an amplifier 307. In addition, the ADC in FIGS. 2 and 3 have a sub-ranging MUX 204, a delay 206, 306, and an encoder 205, 305. The delay 206 in FIG. 2 delays the output of the T/H circuit 201 by the amount of the delay due to the CADC 202 and the sub-ranging MUX 204. In FIG. 3, the delay 306 delays the output of the T/H circuit 301 by the amount due to the CADC 302. By doing so, in FIG. 2, the output of CADC 202 is available at the time when the input (from T/H circuit 201) arrives at FADC 203. This allows FADC 203 to process the incoming signal as soon as it is ready. In FIG. 3, the T/H circuit 301 output is ready for processing when the output of CADC 302 is ready. This allows the output of CADC 302 and the output of T/H circuit 301 to arrive at the signal shifter 304 or, conversely, it allows the CADC 302 output to configure the signal shifter 304 appropriately. These configurations allow the FADC 203, 303 to generate its multi-bit output data while, at the same time, CADC 202, 302 generates its next output. Thus, both FADC 203 or 303 and CADC 202 or 302 can operate at their maximum sampling rate for the selected semiconductor technology. Any topology for CADC 202, 302 and FADC 203, 303 can be used in the ADCs illustrated. ADC topologies that produce an output within one clock cycle are preferred as they require less delay from the delay 206, 306 and result in faster operation of the ADC. Since the delay duration of the delay 206, 306 depends on the signal propagation through CADC 202, 302 and the delays through the sub-ranging MUX 204, the ADC can operate at any clock rate up to a certain maximum that is limited by a particular choice of CADC 202, 302 and FADC 203, 303. It should be clear that the delay 206 or 306 is not ADC-clock dependent.

Figure 4:
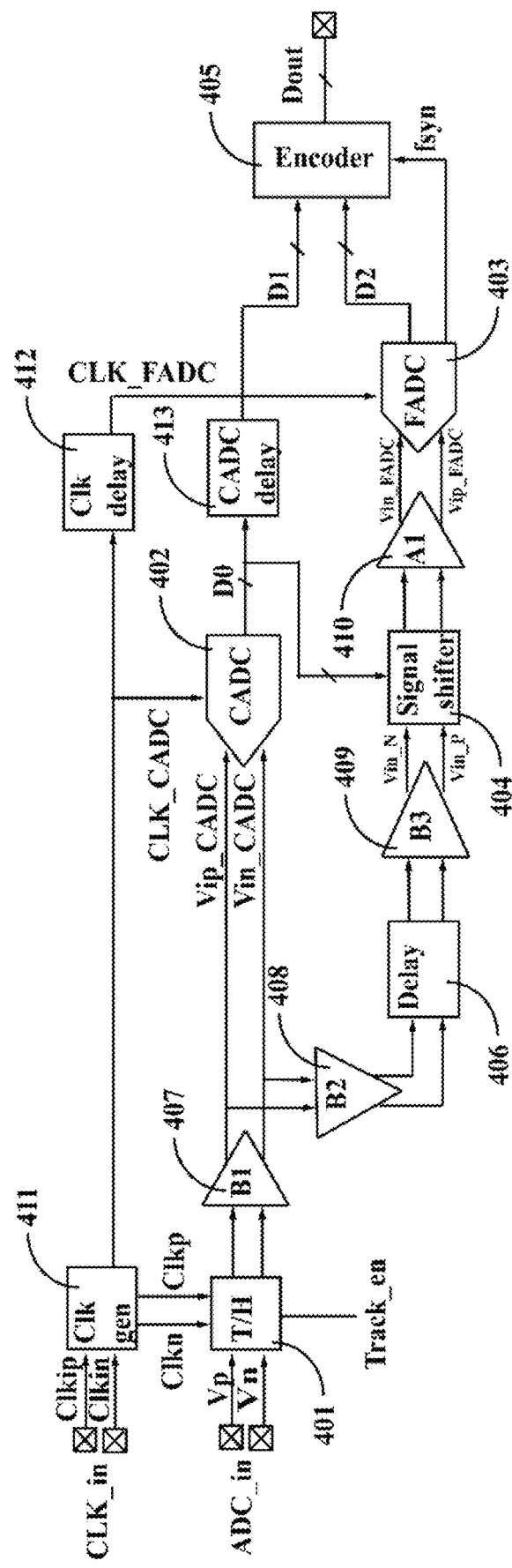
FIG. 4 is a block diagram of one implementation of the ADC system illustrated in FIG. 3.

Referring to FIG. 4, a more detailed embodiment of the system in FIG. 3 is illustrated. The embodiment in FIG. 4 details the clock signal sources as well as a CADC delay 413 that delays the CADC 402 output so that the FADC 403 output and the CADC 402 output can by synchronised when being sent to the encoder 405. It should be clear that, to accomplish this, the CADC delay 413 delays the CADC 402 output by the amount delay due to the signal shifter 404, the amplifier A1 410, and the FADC 403 processing. It should also be clear that, since configuring the signal shifter 404 using the CADC 402 output also causes a delay, the delay 406 that delays the optional T/H 401 output by an amount equal to the delay due to the CADC 402 processing and the configuration of the signal shifter 404.

In terms of the functioning of the sub-ranging ADC in FIG. 4, the system operates as described below. It should, of course, be clear that, while the description below indicates that events occur on a negative or a positive edge of a signal, the various portions of the system may be configured to occur on the other edge of that signal (i.e., the positive or the negative edge of a signal). As an example, while the T/H block 401 samples the input signal and, on the CLK_in negative edge, the block 401 holds the sampled voltage at its output, the T/H block 401 may hold the sampled voltage on the positive edge of the CLK_in. Thus, when the description describes events or functions occurring when a specific positive or negative edge occurs, the system can be configured such that these events or functions will happen when the other edge occurs.

In the system, the T/H block 401 samples the input signal (ADC_in) over half of the CLK_in period and, on the CLK_in negative edge, holds the sampled voltage at its output for the second half of the CLK_in period. As the CLK_in negative edge arrives, CADC 402 starts converting the output of the T/H block 401 to a multi-bit digital output D0. When the output of T/H 401 is ready (when the negative edge of CLK_in arrives), the T/H output starts propagating through buffer B2 408, delay 406, and buffer B3 409. T/H block 401 holds its output for a half of clock period until CLK_in experiences a positive edge. By the time CLK_in experiences the positive edge, CADC 402 has generated its multi-bit digital output D0 and has applied it to the signal shifter 404. The buffers 408, 409, and delay 406 delay the output of T/H block 401 to ensure that the signal shifter 404 is properly configured by the digital output D0. Note that it may be required for the multi-bit digital output of CADC 402 to propagate through some additional logical gates (e.g. for data correction or encoding) before appearing at the signal shifter 404. This does not affect the performance of the ADC but this would require a longer delay from delay block 406.

After passing through the delay block 406, the output of T/H block 401 emerges at the output of B3 buffer block 409 and appears at the input of the signal shifter 404 soon after D0 has been generated by CADC 402 and after signal shifter 404 has been configured. The digital output D0 configures the signal shifter 404 such that the incoming signal from T/H block 401 is shifted to the common-mode voltage level for amplifier A1 410. The common-mode voltage level of the output of amplifier A1 410 aligns with the input-signal common-mode level for FADC 403. The gain of amplifier A1 410 is such that the output of amplifier A1 410 does not exceed the maximum input voltage range of FADC 403. While the signal is being processed by FADC 403, the multi-bit digital output D0 from CADC 402 also propagates through CADC delay block 413. The CADC delay block 413 is designed such that its output is available at the time the multi-bit digital output of FADC 403 is also available. The two multi-bit digital outputs (from CADC delay block 413 and FADC block 403) are combined in encoder 405 to form the final ADC multi-bit output. The encoder 405 may also be designed to apply error correction.

For clarity, it should be noted that T/H block 401 enters the hold mode on a negative transition of the clock signal CLK_in and buffer B1 407 provides the input to CADC 402. Clock signal CLK_CADC is designed to arrive at CADC 402 in a delayed manner. CLK_CADC is delayed by the time it takes for T/H block 401 to enter the hold mode and for the output of T/H block 401 to propagate through buffer B1 407. Clk_gen block 411 delays the clock signal CLK_CADC relative to the clock signals Clkn and Clkp (Clkn and Clkp being differential clock signals for T/H block 401) so that CADC 402 starts its operation when the output of buffer B1 407 is ready. It should be clear that Clkn and Clkp indicate positive and negative clock signals for a differential CLK_in. A single-ended CLK_in may also be used with some reconfiguration of some of the components and clock signals being used.

It should also be noted that the clock signal CLK_FADC (for FADC 403 and from Clk_gen block 411) is delayed relative to CLK_CADC by Clk_delay block 412. This is accomplished so that FADC 403 only starts its operation once the output signal of buffer B1 407 arrives at FADC 403 by way of buffer B2 408, delay block 406, buffer B3 409, signal shifter 404, and amplifier A1 410.

Returning to FIG. 4, it can be seen that encoder 405 is triggered by an fsyn signal generated by FADC 403. This indicates that the output of FADC 403 is ready. Once triggered, encoder 405 accepts outputs from FADC 403 and CADC delay block 413, performs any data correction, and generates the multi-bit ADC overall output.

Regarding variants and details about implementation for the system in FIG. 4, a number of enhancements can be implemented. As an example, in some applications, the gain of amplifier A1 410 can be set such that its output is below the maximum input voltage range of FADC 403 to allow for consecutive error correction. For implementation, the CADC delay block 413 can be implemented with standard digital gates such as registers, flip-flops, or inverters. Delay block 406 can be implemented with a transmission line, which can be implemented with transmission lines on a printed circuit board or, on chip, with coaxial cables, with passive circuit components, active or passive filters, or with track and hold (T/H) circuits. Depending on the particular implementation, buffers B2 408 and B3 409 may not be necessary. It should be clear that the signal shifter may be implemented with a DAC and a subtractor.

Figure 5:
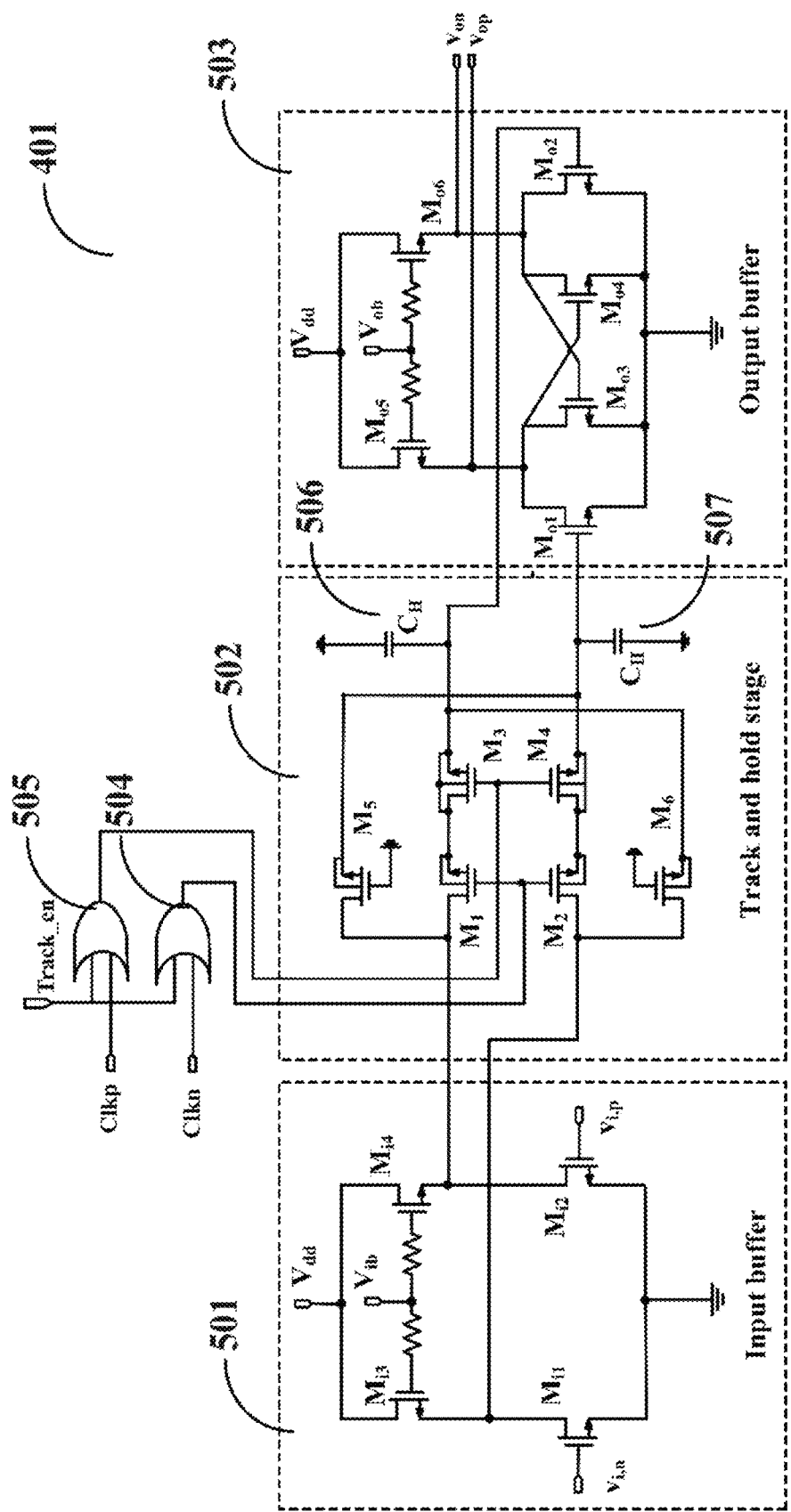
FIG. 5 is a detailed diagram of a T/H (track and hold) block that may be used with the present invention.
Figure 6:
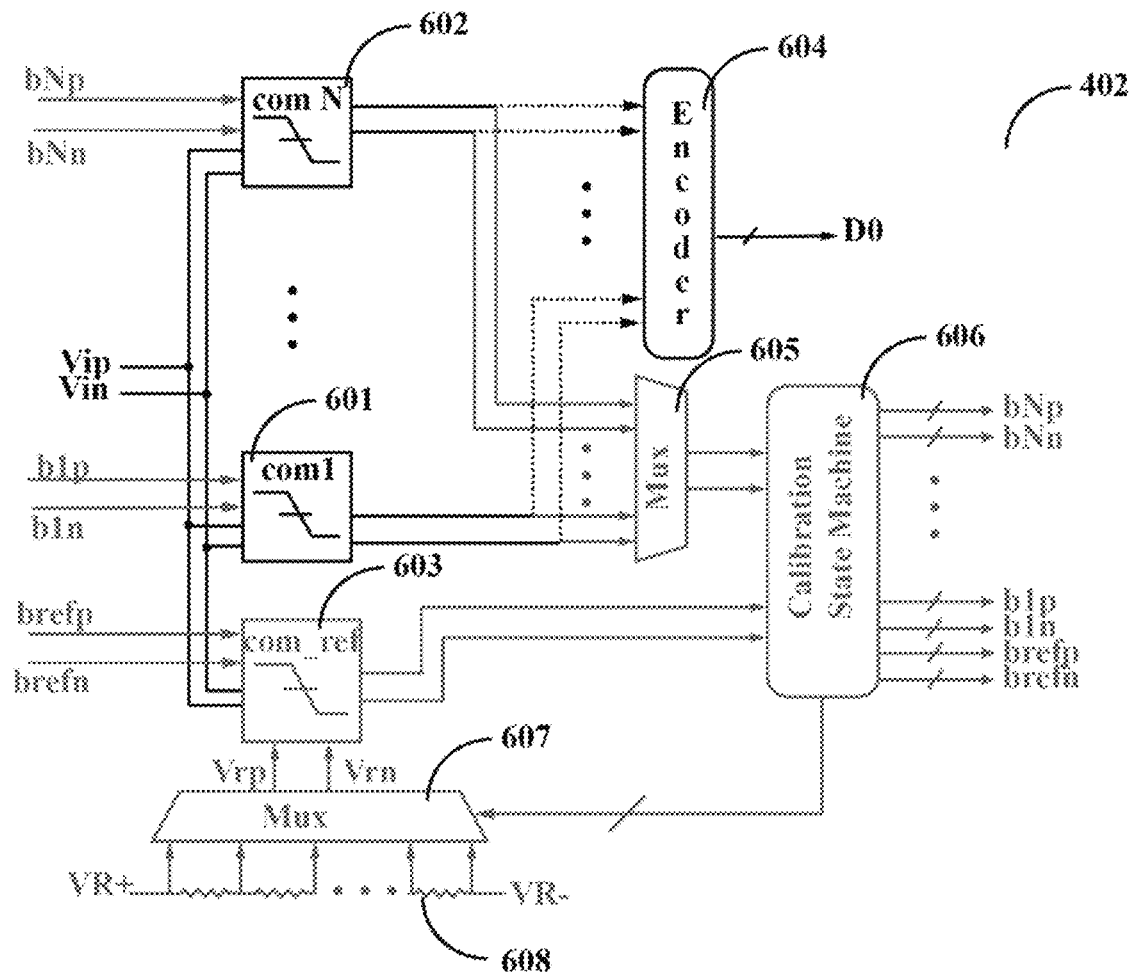
FIG. 6 is a detailed diagram of an CADC or a FADC block that may be used with the present invention.
Figure 7:
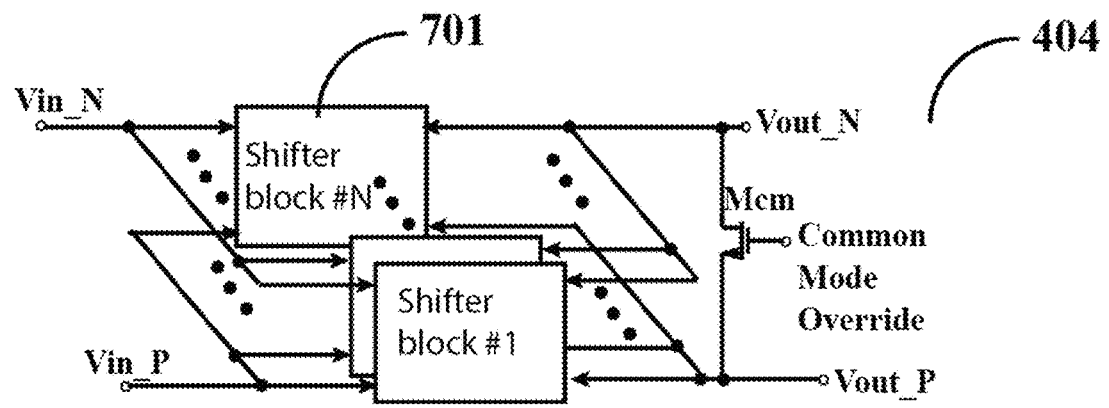
FIG. 7 is a diagram of a signal shifter block that may be used with the present invention.
Figure 8:
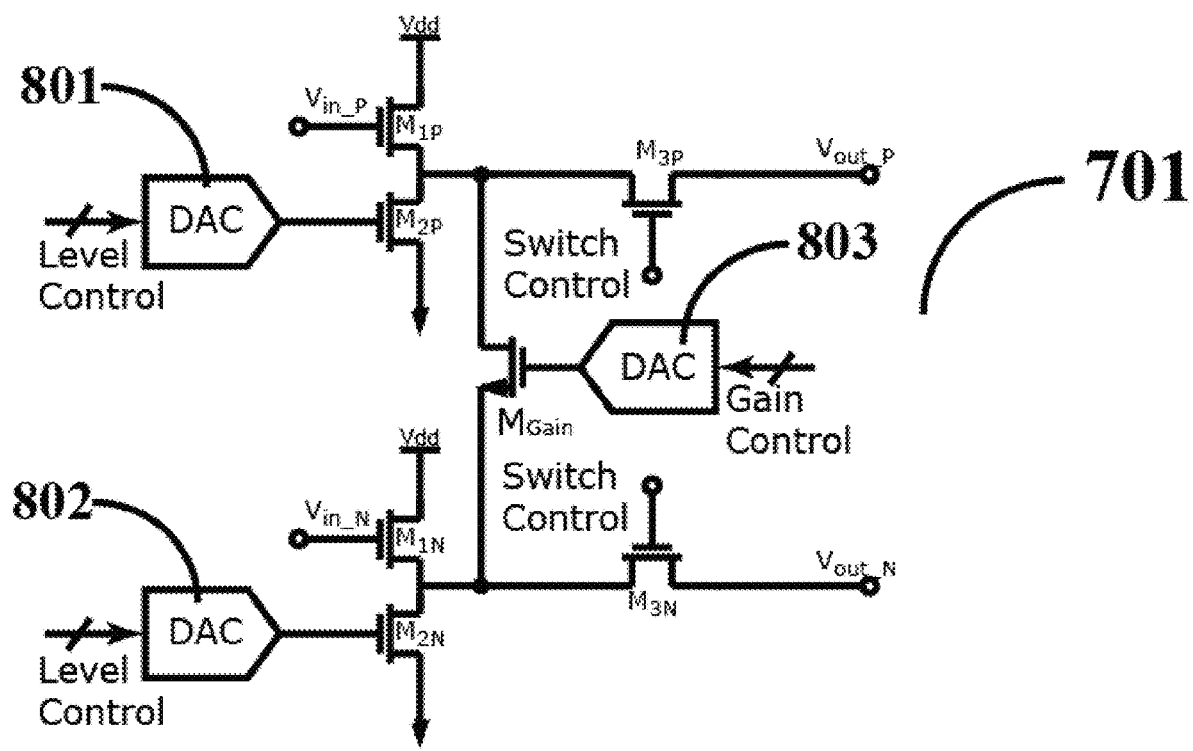
FIG. 8 is a diagram illustrating a shift block that may be used with the signal shifter illustrated in FIG. 7.
Figure 9:
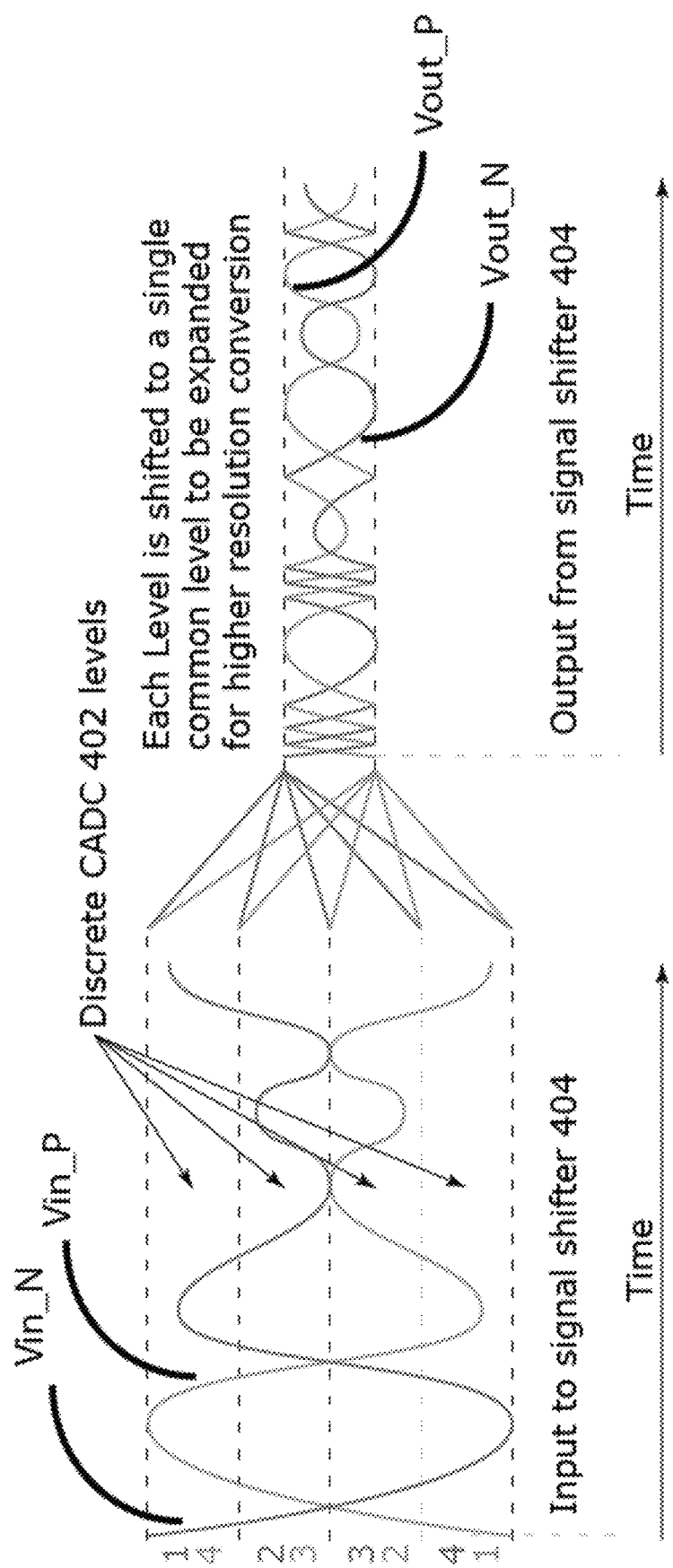
FIG. 9 schematically illustrates the effect of the signal shifter on an input signal.

The optional T/H block 401 may be as illustrated in FIG. 5. The CADC 402 may be as illustrated in FIG. 6 while the signal shifter may be as shown in FIG. 7. For the signal shifter in FIG. 7, each shifter block 701 may be as shown in FIG. 8. FIG. 9 shows the waveforms for the input signal to signal shifter 404 and for the output signal from signal shifter 404.

Referring to FIG. 5, this implementation of a track and hold block 401 has an input buffer 501, a core track and hold stage 502, and an output buffer 503. As well, the block 401 has gates 504 and 505 to supply a differential clock and has a Track_en signal that is used to set the T/H block 401 in a tracking mode. Capacitors 506 and 507 are used for holding the input signals and for providing the T/H block 401 output. Of course, other embodiments of the T/H block 401 could be used in the ADC of FIGS. 2 and 3 instead of the one in FIG. 5.

Referring to FIG. 6, the configuration for a 4-bit flash CADC 402 is illustrated. Similarly configured ADC blocks can also be considered to implement the FADC 403. It should be understood that other ADC blocks with some other number of bits can be used instead. The ADC block in FIG. 6 uses N comparators 601 to 602, with each comparator having different input transistor sizes to adjust the reference level. The CADC 402 in FIG. 6 also uses a reference comparator com_ref 603 for calibration. The reference comparator 603 uses a low-power resistive ladder 608 to generate its reference levels. Typically, the input to a CADC 402 is differential. Those familiar with ADC circuits can appreciate that a single-ended version can be readily implemented instead. As well, it should be clear that, for this CADC 402 in FIG. 6, the conversion sequence begins on a positive clock edge but that a negative clock edge can also be used.

Referring to FIG. 7, a particular implementation of the signal shifter 404 is illustrated. In this implementation, the number of shifter blocks 701 depends on the number of quantization levels in the CADC 402. One shifter blocks 701 is required for each quantization level of CADC 402. Other implementations of the signal shifter 404 are, of course, possible.

FIG. 8 illustrates a possible configuration for a shifter block as used in the signal shifter of FIG. 7. For this shifter block 701, differential inputs Vin_p and Vin_n are accepted. Digital-to-analog subblocks (DACs) 801, 802, and 803 can be used to calibrate the operation of each shifter block 701. These DAC subblocks are controlled via an on-chip state machine or from an external computer. In this embodiment of the shifter block 701, each shifter block 701 has two two-transistor source followers $M_{1N}$ and $M_{2N}$ and $M_{1P}$ and $M_{2P}$. Together, these form a pseudo-differential shifter block 701. The shift voltage is determined by the voltage generated by DAC subblock 801 on the gate of transistor $M_{2P}$ and by DAC subblock 802 on the gate of $M_{2N}$. The level control signals for DAC subblocks 801 and 802 are supplied by an on-chip state machine or by an external computer.

Figure 10:
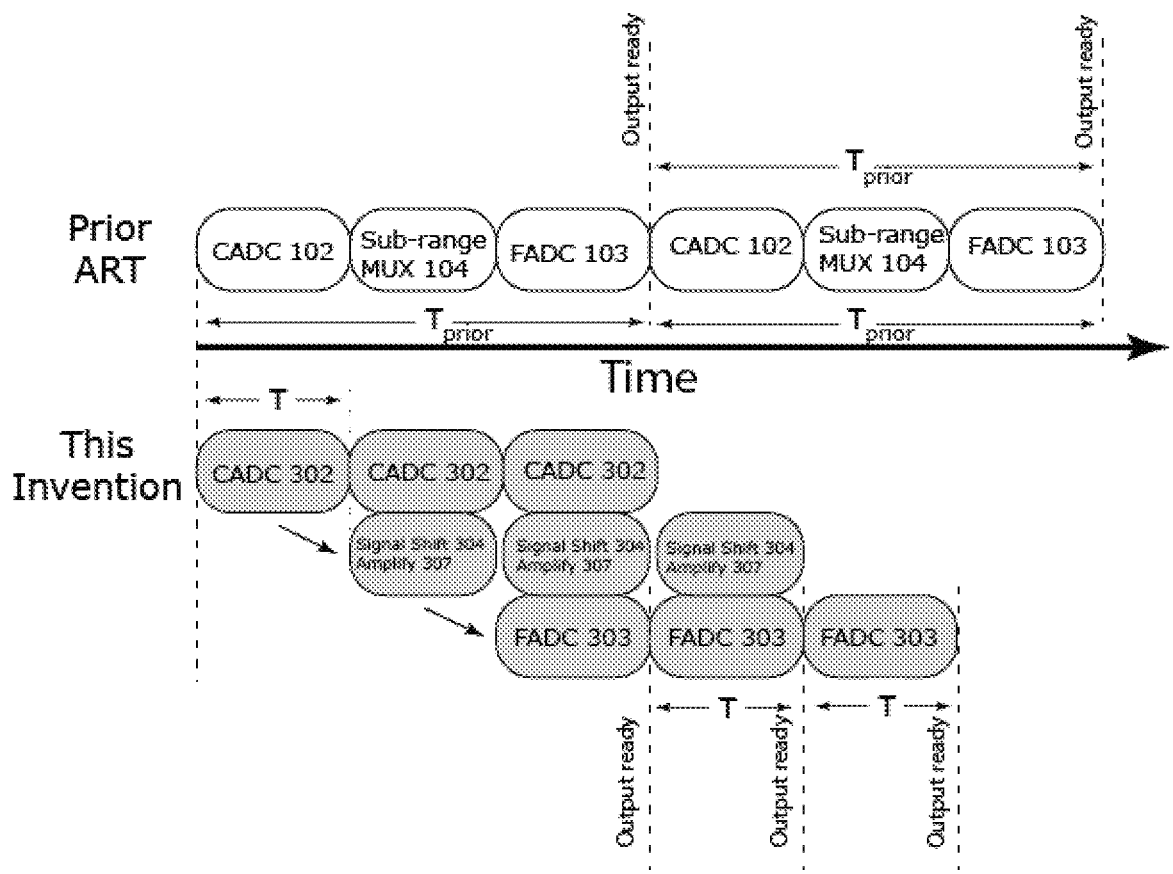
FIG. 10 schematically illustrates a comparison between throughputs of an ADC according to the prior art and an ADC according to the present invention.

The sub-ranging ADC illustrated in FIGS. 2 and 3 does not operate in a sequential mode. Rather, it generates an output at each CLK_in period, T, as shown in FIG. 10. As can be seen from FIG. 10, once the ADC receives a number of input signals and once the system operates akin to a pipeline, an output from the FADC is ready for each subsequent clock period. Of course, this throughput can be achieved once the input signals have been properly spooled into the effective pipeline of the sub-ranging ADC.

It should be clear that the implementations of the ADC shown in FIGS. 3 and 4 do not preclude time interleaving to increase the ADC sampling rate. Time interleaving is a well-known approach for increasing the sampling rate of an ADC by building a high-sampling-rate ADC from a plurality of low-sampling-rate ADCs. Each of these low sampling ADCs has their clock signals offset in the time domain so that they operate sequentially, thereby producing data at a higher rate than the capability of each low-sampling-rate ADC. Time interleaving can be used in a number of ways. The ADC of the present invention can be time interleaved by having multiple instances of the ADC to thereby increase the overall sampling rate. This, however, may not be efficient as some common components would be repeated. A more efficient way would reuse some high-power or large components across the various instances of the ADC. Two examples of such approaches are shown FIG. 11 and FIG. 12.

Figure 11:
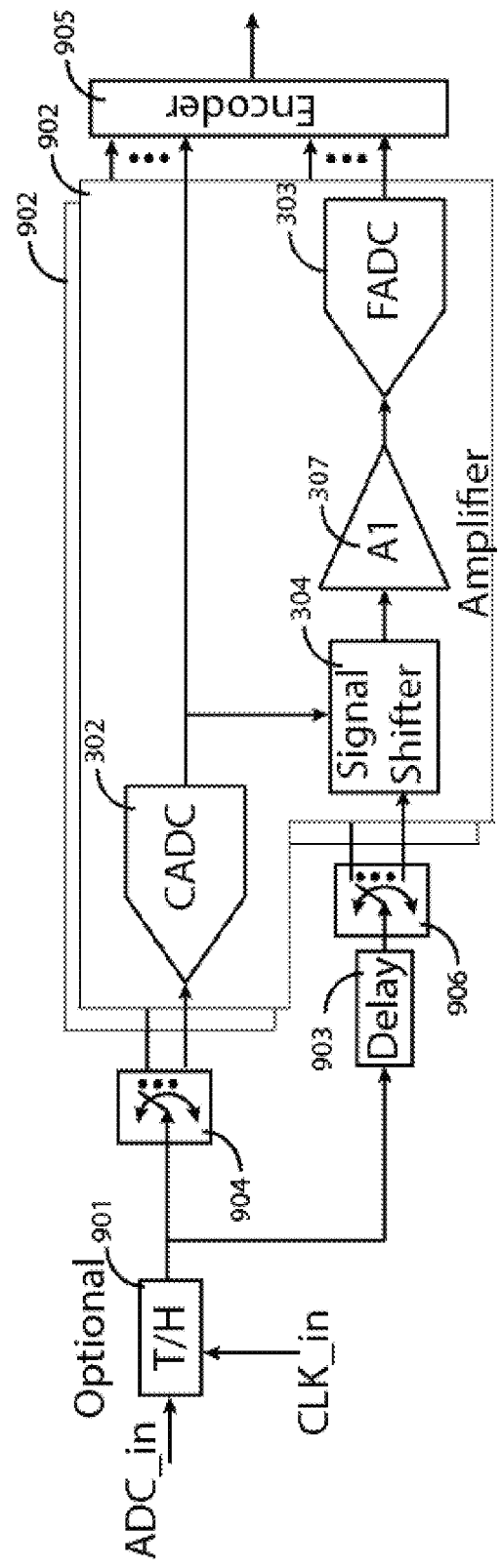
FIG. 11 schematically illustrates multiple instances of one aspect of the present invention as used in a time interleaved ADC system using fast T/H circuits.

As can be seen in FIG. 11, the T/H block 901 tracks and holds the input signal. The output of block 901 is received by a switch block 904 that switches the input signal between the various parallel instances of the ADC 902. This same input signal is received by the delay block 903 and, afterwards, is switched through switch block 906 to one of the parallel instances of the ADC 902.

Figure 12:
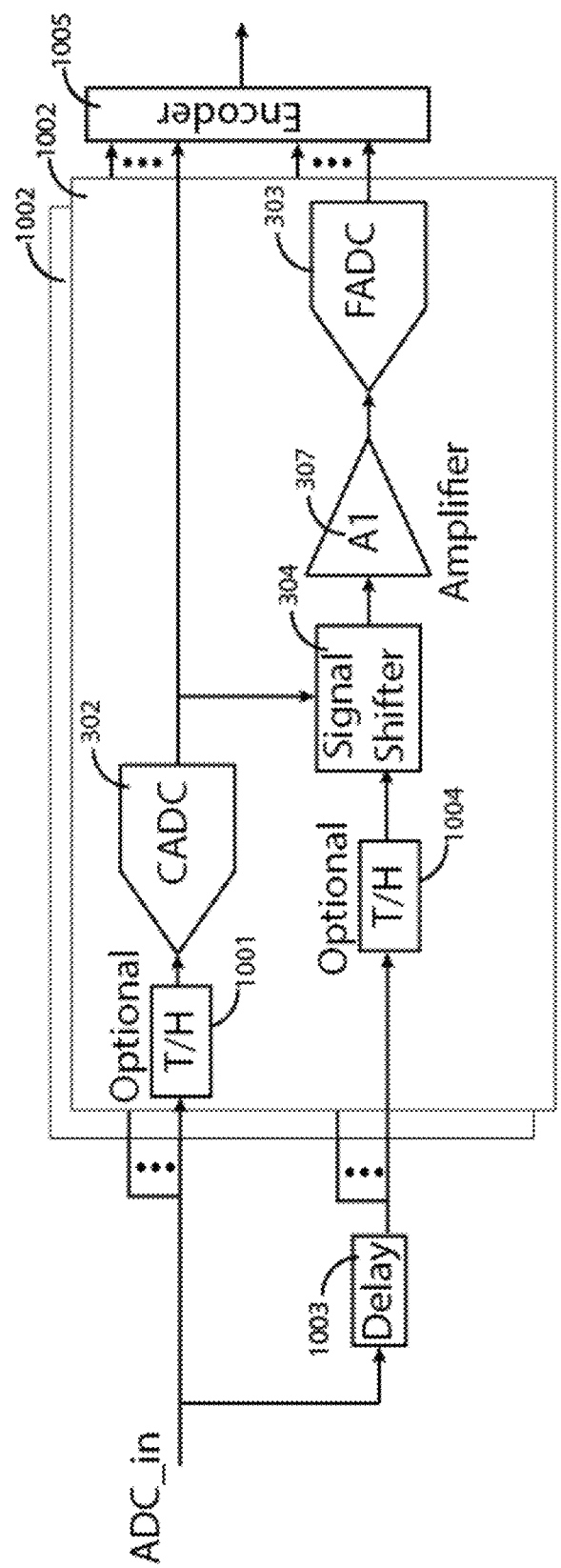
FIG. 12 schematically illustrates multiple instances of one aspect of the present invention as used in a time interleaved ADC system using slow T/H circuits.

In FIG. 12, multiple instances of the ADC 1002 are used. The input signal is received by delay block 1003 and sent to the various instances of ADC 1002. An undelayed version of this input signal is also received by the various instances of the ADC 1002. In each instance of the ADC 1002, the undelayed version of the input signal is received by a T/H block 1001 and then by a CADC 302. The delayed version of the input signal is received by another T/H block 1004 and then by the signal shifter 304. As can be seen, the configuration of each ADC 1002 is very similar to the configuration of the ADC in FIG. 3.

In the configurations in FIGS. 11 and 12, the delay block 903 and delay block 1003 are reused for all slow rate ADCs 902 and ADCs 1002. In the configuration of FIG. 11, the T/H block 901 is required to operate at a high sampling rate. In FIG. 12 the two T/H blocks 1001 operate at the rate of the slow-sampling ADC 1002. In both configurations, delay block 903 and delay block 1003 are used to generate a delay that is sufficiently long so that the delayed output of the delay block arrives at the time when the signal shifter 304 has been sufficiently programmed by the output of CADC 302.

A number of calibration methods can be applied to the ADC of the present invention. In order to compensate for process-voltage-temperature (PVT) variations, both voltage offsets and timing sequences for the ADC require calibration.

For the ADC to operate properly in view of potential process, voltage, temperature (PVT) variations, a calibration is required. In one embodiment this calibration includes calibrating the T/H block 401, CADC 402, FADC 403, and the signal shifter 404, Clk gen block 411, and the Clk delay block 412.

The calibration starts by calibrating the common-mode voltage of the reference comparator 603 for CADC 402 (see FIG. 6). The T/H block 401 includes a provision to apply a known differential voltage that is supplied from an external source. In some implementations, a differential DAC (dDAC), controlled by either an on-chip state machine or an external computer, can be used to supply such known differential voltage. For implementations using this configuration, a provision for calibrating the dDAC is provided. During the calibration of the CADC 402, the output of the T/H block 401 is placed in a high-impedance state. For each differential reference voltage level generated by the resistor ladder 608 and applied to the comparator 603 by MUX 607, the reference comparator 603 is then tuned until the voltage supplied to the reference comparator 603 toggles the output of the reference comparator 603. In some implementations, it can be assumed that the reference ladder 608 is sufficiently accurate. If the accuracy of reference ladder 608 is not sufficient for a particular situation, the reference ladder 608 would require its own calibration or it can be replaced with an externally supplied reference voltage. With the reference comparator 603 calibrated, the reference comparator 603 can then be used as the reference for other calibration steps.

Using the reference comparator 603, the common mode of the T/H block 401 is adjusted with a built-in DAC that is controlled by a state machine or by an external computer. This built-in DAC adjusts the common-mode output voltage of T/H block 401 until the voltage triggers a transition of the output of reference comparator 603.

Once the T/H block 401 has been calibrated, the dDAC can then be configured to supply a known voltage to the calibrated reference comparator 603. The calibrated reference comparator is used to assign the voltage levels to the dDAC states based on the switching points of the reference comparator 603. This calibration does not adjust the dDAC but rather finds the digital equivalent values of the switching voltages and saves them to memory.

Afterward, the CADC 402 is calibrated by controlling the calibrated dDAC with an on-chip state-machine or with an external computer to present a known voltage to the comparators 601 and to the reference comparator 603 of CADC 402 (see, again, FIG. 6). The results from comparators 601 and reference comparator 603 are applied to a local on-chip state machine 606 through MUX 605. The state machine adjusts comparator 601 until comparators 601 and the reference comparator 603 (connected to the reference ladder 608 via MUX 607) both trigger in response to the dDAC output. Each comparator 601 to 602 has capacitor banks that adjust the switching threshold value of the comparator. This procedure is repeated for each of the comparators 601 to 602 in the CADC 402.

The calibration of FADC 403 follows the same process as the calibration of CADC 402. The calibration starts with the calibration of the reference comparator by applying a known voltage to its input while the amplifier A1 410 output is in a high impedance state. The states of the dDAC output voltages, flowing through buffer B1 407, buffer B2 402, delay block 406, buffer B3 409, and amplifier A1 410, are associated with the FADC 403 reference comparator switching levels. The dDAC and the reference comparator 603 for FADC 403 are then used to calibrate FADC 403 comparators 601 to 602.

Calibration of the shifter blocks 701 of signal shifter 404 proceeds to output the correct common mode voltage (See FIG. 8). This is done by connecting the shifter block 701 outputs together with transistor $M_{Gain}$ and turning on either of transistors $M_{3P}$ or $M_{3N}$. The dDAC is set mid-level between two consecutive switch points of FADC 403. Using this input level, the signal block 701 is adjusted with the DAC 801 or 802 to the point where the reference comparator 603 on the FADC 403 switches. Then, the either of $M_{3P}$ or $M_{3N}$ is turned on and DAC 801 or 802 is used to adjust the other input side of the shifter block 701. This procedure is repeated for each shifter block 701.

To clarify the above, $M_{Gain}$ acts as a variable resistor between differential outputs of shifter block 701. By varying the resistor value, the gain of shifter block 701 can be varied. Because $M_{Gain}$ acts as a resistor, its drain terminal and source terminal can be used interchangeably. As can be seen, FIG. 8 shows that the negative output of shifter block 701 is connected to the source terminal of $M_{Gain}$.

Also for clarity, it should be clear that, in FIG. 7, the outputs of shifter blocks 701 are shown with a single line. It should be clear that these single lines indicate either single-ended interconnections or differential interconnects.

The gain of each shifter block 701 is calibrated so that the output of amplifier A1 410 achieves the full input range for FADC 403. In implementations where error correction is applied, the output of amplifier A1 410 is set lower than the full input range of FADC 403. At first, the gain of all shifter blocks 701 is set to the maximum (a convenient but not unique starting point) with $M_{Gain}$ by controlling DAC 803 and the dDAC is set to a level slightly below or slightly above the maximum switching level of each shifter block 701. The multi-bit digital output of FADC 403 is then used to adjust the gain to achieve the required range on the FADC 403 for each shifter block 701. If one shifter block 701 cannot reduce its gain enough to reach the full input range of FADC 403, the global level is lowered and the signal shifter 404 calibration process restarts.

Since, for some implementations of delay block 406, fixed transmission lines might be used, the delay amount for the delay block 406 cannot be easily adjusted. Therefore, the timing path is established by the clock timing flow of all the circuits.

By setting the input of the T/H 401 to common mode, the T/H 401 clock feed-through (i.e. the coupling of a signal to another node) is used to determine the Clk gen 411 delay. By sweeping Clk gen 411 delay from minimum to maximum and monitoring the output of the CADC 402, the Clk gen 411 delay that results in CLK_CADC falls in the middle between T/H 401 clock edges of CLK_in (i.e. Clkn and Clkp) is retained.

Similarly, for CLK_FADC, the delay for Clk delay 412 can be found when the signal shifter 404 is set to its middle input point and the control from CADC 402 is disabled.

It should be clear that the various aspects of the present invention may be implemented as software modules in an overall software system. As such, the present invention may thus take the form of computer executable instructions that, when executed, implements various software modules with predefined functions.

To better understand the present invention, the reader is directed to the following listing of citations. The contents of these citations are hereby incorporated by reference herein in their entirety.

[1] E. Alpman, H. Lakdawala, L. R. Carley, and K. Soumyanath, "A 1.1V 50 mW 2.5 GS/s 7b Time-Interleaved C-2C SAR ADC in 45 nm LP digital CMOS", IEEE International Solid-State Circuits Conference (2009), pp. 76-77,77a.

[2] Y. Chung and J. Wu, "A 16-mW 8-Bit 1-GS/s subranging ADC in 55 nm CMOS", in 2011 Symposium on VLSI Circuits—Digest of Technical Papers (2011), pp. 128-129.

[3] P. M. Figueiredo, P. Cardoso, A. Lopes, C. Fachada, N. Hamanishi, K. Tanabe, and J. Vital, "A 90 nm CMOS 1.2 v 6 b 1 GS/s two-step subranging ADC", IEEE International Solid State Circuits Conference (2006), pp. 2320-2329.

[4] Y. M. Greshishchev, J. Aguirre, M. Besson, R. Gibbins, C. Falt, P. Flemke, N. Ben-Hamida, D. Pollex, P. Schvan, and Shing-Chi Wang, "A 40 GS/s 6 b ADC in 65 nm CMOS", IEEE International Solid-State Circuits Conference (2010), pp. 390-391.

[5] Y. Hu, C. Shih, H. Tai, H. Chen, and H. Chen, "A 0.6V 6.4 fJ/conversion-step 10-bit 150 MS/s subranging SAR ADC in 40 nm CMOS", IEEE Asian Solid-State Circuits Conference (2014), pp. 81-84.

[6] Y. Lien, "A 4.5-mW 8-b 750-MS/s 2-b/step asynchronous subranged SAR ADC in 28-nm CMOS technology", Symposium on VLSI Circuits (2012), pp. 88-89.

[7] S. Limotyrakis, S. D. Kulchycki, D. K. Su, and B. A. Wooley, "A 150-MS/s 8-b 71-mW CMOS time-interleaved ADC", IEEE Journal of Solid-State Circuits 40, 5 (2005), pp. 1057-1067.

[8] B. Vaz, J. Goes, and N. Paulino, "A 1.5-V 10-b 50 MS/s time-interleaved switched-opamp pipeline CMOS ADC with high energy efficiency", Symposium on VLSI Circuits (2004), pp. 432-435.

[9] G. Wu, E. Zailer, L. Belostotski, J. W. Haslett, and R. Plume, "A 10-GS/s track-and-hold circuit for a 7-bit Square Kilometre Array ADC in 65-nm", IEEE Topical Meeting on Silicon Monolithic Integrated Circuits in RF Systems (2017), pp. 68-71.

[10] D. Xing, Y. Zhu, C. Chan, F. Maloberti, S. U, and R. P. Martins, "Design of a High-Speed Time-Interleaved Sub-Ranging SAR ADC With Optimal Code Transfer Technique", IEEE Transactions on Circuits and Systems I: Regular Papers (2018), pp. 1-13.

[11] Y. Xu, L. Belostotski, and J. W. Haslett, "A 65-nm CMOS 10-GS/s 4-bit Background-Calibrated Noninterleaved Flash ADC for Radio Astronomy", IEEE Transactions on Very Large Scale Integration (VLSI) Systems (2013).

[12] Y. Xu, L. Belostotski, and J. W. Haslett, "A 65-nm CMOS 10-GS/s 4-bit Background-Calibrated Noninterleaved Flash ADC for Radio Astronomy", IEEE Transactions on Very Large Scale Integration (VLSI) Systems 22, 11 (2014), pp. 2316-2325.

[13] J. Liu, S. Li, W. Guo, G. Wen and N. Sun, "A 0.029-mm2 17-fJ/Conversion-Step Third-Order CT DS ADC With a Single OTA and Second-Order Noise-Shaping SAR Quantizer," IEEE Journal of Solid-State Circuits, vol. 54, no. 2, pp. 428-440, February 2019.

[14] J. van Valburg and R. J. van de Plassche, "An 8-b 650-MHz folding ADC," IEEE Journal of Solid-State Circuits, vol. 27, no. 12, pp. 1662-1666, December 1992.

[15] U.S. Pat. No. 5,982,313
[16] US Patent Publication 2015/0249445
[17] U.S. Pat. No. 7,187,318
[18] U.S. Pat. No. 6,489,913
[19] U.S. Pat. No. 8,164,497
[20] U.S. Pat. No. 7,791,523
[21] U.S. Pat. No. 7,978,116
[22] U.S. Pat. No. 7,808,417
[23] U.S. Pat. No. 9,264,059

A person understanding this invention may now conceive of alternative structures and embodiments or variations of the above all of which are intended to fall within the scope of the invention as defined in the claims that follow.

What is claimed is:

1. A system for assigning a digital value to a current or voltage signal level, the system comprising:
   a coarse ADC block for receiving an input signal and for performing a coarse analog-to-digital conversion process on said input signal; and
   a delay block for delaying said input signal prior to passing said input signal to a further processing block that is configured based on an output of said coarse ADC block;

wherein said delay block delays said input signal to allow said further processing block to be configured by said output of said coarse ADC block, wherein said coarse analog-to-digital conversion process is applied over a full input signal range, and wherein a delay due to said delay block is based on an amount of time for said input signal to propagate through said coarse ADC block.

2. The system according to claim 1, wherein said further processing block is a fine ADC block for receiving said input signal from said delay block, said fine ADC block being for performing a fine analog-to-digital conversion process on said input signal, said fine analog-to-digital conversion process being focused around a voltage level of said input signal.

3. The system according to claim 1, wherein said further processing block is a signal shifter for shifting a voltage level of said input signal.

4. The system according to claim 3, wherein an output of said signal shifter is received by a fine ADC block for performing a fine analog-to-digital conversion process on said input signal and wherein said signal shifter shifts a voltage level of said input signal to align with a voltage level for said fine ADC block and wherein said fine analog-to-digital conversion process is focused around a voltage level of said input signal.

5. The system according to claim 4, wherein said output of said signal shifter is amplified by an amplifier prior to being received by said fine ADC block.

6. The system according to claim 4, wherein an output of said fine ADC block and an output of said coarse ADC block are received by an encoder that produces an output of said system.

7. The system according to claim 1, wherein said delay block is implemented using at least one of: transmission lines, passive circuits, and active circuits.

8. The system according to claim 1, wherein a delay due to said delay block is invariant relative to clock signals used in said system.

9. The system according to claim 1, wherein said input signal is received from a track-and-hold block that samples and holds said input signal.

10. The system according to claim 1, wherein multiple instances of said system are configured to operate in a time-interleaved fashion such that said multiple instances of said system have offset clock signals relative to one another such that said multiple instances of said system operate sequentially to produce an overall output at a higher rate than a single instance of said system.

11. The system according to claim 1, wherein multiple instances of said system are combined to form a pipelined ADC.

12. A method for converting analog values to digital values, the method comprising:
    (a) simultaneously receiving an input analog value at a delay element and at a coarse ADC element;
    (b) delaying said input value until said coarse ADC element has an output based on said input value;
    (c) processing said delayed input value and said output of said coarse ADC element using a fine ADC element;
    (d) receiving said output of said coarse ADC element and an output of said fine ADC element at an encoder, said output of said fine ADC element being based on said delayed input value, wherein a delay due to said delay element is based on an amount of time for said input value to propagate through said coarse ADC block.

13. The method according to claim 12, wherein step (c) comprises receiving said delayed input value and a multiplexer output at said fine ADC element, said multiplexer output being based on said output of said coarse ADC element.

14. The method according to claim 13, wherein said output of said fine ADC element is based on said delayed input value and said multiplexer output.

15. The method according to claim 13, wherein said multiplexer is a sub-ranging multiplexer.

16. The method according to claim 12, wherein step (c) comprises receiving said delayed input value and said output of said coarse ADC element at a signal shifter element.

17. The method according to claim 16, wherein step (c) further comprises receiving an output of said signal shifter element at said fine ADC element, said fine ADC element producing an output based on said output of said signal shifter element.

18. The method according to claim 16, wherein said output of said coarse ADC element configures said signal shifter element.

19. The method according to claim 16, wherein said output of said fine ADC element is generated while said input value being processed by coarse ADC is a next input value.

20. The method according to claim 12, wherein said input analog value is received from a track and hold element.

* * * * *